United States Patent [19]

Flannagan

[11] Patent Number: 4,644,196
[45] Date of Patent: Feb. 17, 1987

[54] TRI-STATE DIFFERENTIAL AMPLIFIER
[75] Inventor: Stephen T. Flannagan, Austin, Tex.
[73] Assignee: Motorola, Inc., Schaumburg, Ill.
[21] Appl. No.: 695,643
[22] Filed: Jan. 28, 1985
[51] Int. Cl.[4] .......................... H03K 5/24; G11C 7/06
[52] U.S. Cl. .................................... 307/530; 307/355;
307/473; 365/190; 365/227
[58] Field of Search ............... 307/530, 355, 362, 473,
307/296 R, 496, 497, 592, 594; 365/207, 208,
365/190, 226, 227; 330/253, 257

[56] References Cited

U.S. PATENT DOCUMENTS

| | | | |
|---|---|---|---|
| 3,882,326 | 5/1975 | Kruggel | 307/530 |
| 4,130,897 | 12/1978 | Horne et al. | 365/227 X |
| 4,408,133 | 10/1983 | Cooperman et al. | 307/362 |
| 4,420,823 | 12/1983 | Shimada | 365/226 X |

FOREIGN PATENT DOCUMENTS 124929 10/1978 Japan .................................. 307/530
140593 11/1981 Japan .................................. 307/530

OTHER PUBLICATIONS

Marcello et al, "Tri-State Read/Write Control Circuit"; IBM-TDB; vol. 24, No. 1B; pp. 480–482; 6/1981.

*Primary Examiner*—Larry N. Anagnos
*Attorney, Agent, or Firm*—John A. Fisher; Jeffrey Van Myers; James L. Clingan, Jr.

[57] ABSTRACT

An amplifier has a pair of common source transistors in which the sources are coupled together during a first mode of operation and isolated from each other during a second mode of operation. A current source provides current between a power supply terminal and these sources during the first mode and prevents current flow therebetween during the second mode. A pair of switchable loads act as loads for the common source transistors during the first mode and are switched off during the second mode.

8 Claims, 4 Drawing Figures

TRI-STATE DIFFERENTIAL AMPLIFIER

CROSS-REFERENCE TO RELATED APPLICATIONS

Related subject matter is disclosed in U.S. application Ser. No. 06/695,642, entitled "Reduced Power Sense Amplifier", filed simultaneously herewith and assigned to the assignee hereof.

FIELD OF THE INVENTION

This invention relates to differential amplifiers, and more particularly to differential amplifiers which must provide a tri-state output.

BACKGROUND OF THE INVENTION

Many amplifiers or comparators are tied to busses which carry data for circuitry other than that supplied by a particular amplifier. In such a case, and in other cases, it is desirable for the amplifier to provide a high impedance output, commonly known as tri-state. One approach is simply to place a switch between the bus and the amplifier. This works well for the high impedance mode of operation but provides undesirable series resistance between the output of the amplifier and the bus during normal operation of the amplifier. During high impedance operation it is also desirable for the amplifier to not have any current flow. This result can be provided by switching off a transistor in series with a power supply. Although this will effectively disable the amplifier, it does not provide the necessary high impedance output so other means have still been required for this purpose. One reason for this is that in the case of double-ended output amplifiers, the two outputs must be isolated from each other which is not achieved by switching a transistor in series with a power supply.

SUMMARY OF THE INVENTION

An object of the present invention is to provide an improved tri-state amplifier.

Another object of the invention is to provide an improved tri-state configuration for an amplifier.

Yet another object of the invention is to provide a tri-state configuration with reduced effect on output drive of an amplifier.

These and other objects of the invention are achieved in an amplifier having common source transistors in which the sources of the common source transistors are coupled together during a first mode of operation and are isolated from each other during a second mode of operation. A current source provides current between a first power supply terminal and the sources of the common source transistors during the first mode and prevents current therebetween during the second mode.

DESCRIPTION OF THE INVENTION

Figure 1:
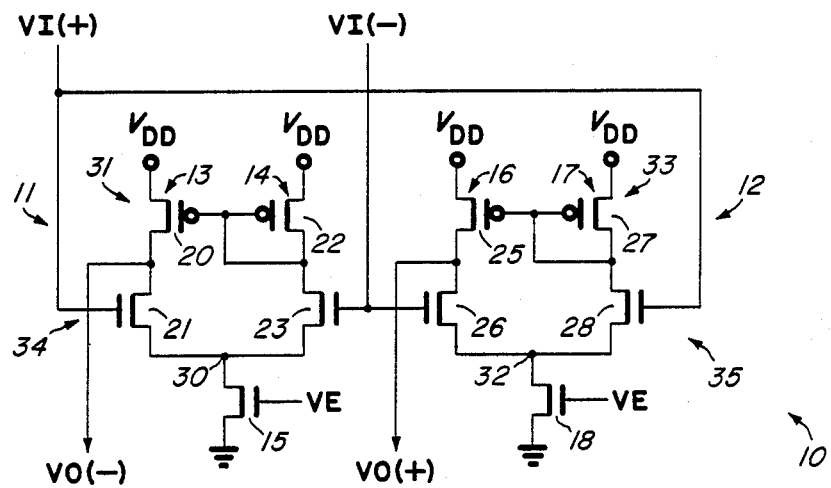
FIG. 1 is a circuit diagram of a sense amplifier of the prior art.

Shown in FIG. 1 is a sense amplifier 10 of the prior art for receiving true and complementary input signals VI(+) and VI(−) and providing complementary output signals VO(+) and VO(−) in response thereto. Sense amplifier 10 is comprised generally of a first differential portion 11 and a second differential portion 12. First differential portion 11 is comprised generally of an inverting amplifier 13, a master mirror circuit 14, and an N channel enable transistor 15. Second differential portion 12 is comprised generally of an inverting amplifier 16, a master mirror circuit 17, and an N channel enable transistor 18. Inverting amplifier 13 is comprised of a P channel transistor 20 and an N channel transistor 21. Master mirror circuit 14 is comprised of a P channel transistor 22 and an N channel transistor 23. Inverting amplifier 16 is comprised of a P channel transistor 25 and an N channel transistor 26. Master mirror circuit 17 is comprised of a P channel transistor 27 and an N channel transistor 28. In this description of the prior art FIG. 1 and of the subsequent description of the invention, the transistors are insulated gate field effect transistors. The N channel transistors have a threshold voltage of 0.5 to 0.8 volt. The P channel transistors have a threshold voltage of −0.5 to −0.8 volt.

Transistor 20 has a source connected to a positive power supply terminal VDD for receiving a positive power supply voltage, for example, 5 volts, a drain for providing complementary output signal VO(−), and a gate. Transistor 21 has a drain connected to the drain of transistor 20, a gate for receiving true input signal VI(+), and a source connected to a node 30. Transistor 15 has a drain connected to a node 30, a gate for receiving an enable signal VE, and a source connected to ground. Transistor 22 has a source connected to VDD, and a gate and a drain connected to the gate of transistor 20. Transistor 23 has a drain connected to the gate and drain of transistor 22, a gate for receiving complementary input signal VI(−), and a source connected to node 30. The connection of the drain and gate of transistor 22 and the drain of transistor 23 form an output of master mirror circuit 14. The gate of transistor 23 is an input of master mirror circuit 14. Transistors 13 and 14 form a current mirror 31 with transistor 22 being a master and transistor 20 being a slave.

Transistor 25 has a source connected to VDD, a drain for providing a true output signal VO(+), and a gate. Transistor 26 has a drain connected to the drain of transistor 25, a gate for receiving complementary input signal VI(−), and a source connected to a node 32. Transistor 18 has a drain connected to node 32, a gate for receiving the enable signal VE, and a source connected to ground. Transistor 27 has a source connected to VDD, and a gate and a drain connected to the gate of transistor 25. Transistor 28 has a drain connected to the drain and gate of transistor 27, a gate for receiving true input signal VI(+), and a source connected to node 32. The connection of the gate and drain of transistor 27 and the drain of transistor 28 form an output of master mirror circuit 17. Transistors 25 and 27 form a current mirror with transistor 25 being a slave and transistor 27 being a master.

In operation, differential portion 11 provides complementary output signal VO(−), and differential portion 12 provides true output signal VO(+). Amplifier 10 is enabled by enabling transistors 15 and 18. Transistors 21, 23 and 15 define a differential amplifier 34 of differential portion 11. A second portion of differential portion 11 is defined by current mirror 31. Amplifier 10 is appropriate for use as a sense amplifier in a static ram access memory (SRAM) in which signals VI(+) and VI(−) are received from a pair of bit lines via a column decoder. These bit lines in operation are typically equalized prior to sensing. In high speed operation the bit lines are equalized at about 3 volts. When a SRAM cell coupled to the pair of bit lines is enabled, the selected SRAM cell causes one of the pair of bit lines to be reduced in voltage. This reduction in voltage is sensed by amplifier 10. Assuming that input signal VI(+) is reduced in voltage while signal VE is a logic high, transistor 21 will become less conductive and thus supply less current to node 30 and transistor 15. This causes transistor 23 to supply more current to node 30 and transistor 15 from transistor 22. As transistor 22 conducts more current, transistor 20 becomes capable of supplying more current so that output signal VO(−) rises in voltage.

Conversely, signal VO(+) is reduced in voltage. As signal VI(+) drops in voltage, transistor 28 responds by becoming less conductive so that less current flows through transistor 27. As transistor 27 experiences reduced current flow, transistor 25 becomes less conductive. Also as transistor 28 becomes less conductive, transistor 26 becomes more conductive. Consequently, signal VO(+) drops very quickly in voltage. If transistor 28 becomes completely non-conductive, then transistor 27 will not be conducting, which in turn causes transistor 25 to be non-conducting. With no current flowing, node 32 will be at ground and so will output signal VO(+).

Differential portion 11, however, will have substantial current flowing through transistors 22 and 23 and thus transistor 15. This is significant in a memory because for every grouping of bit-line pairs on a given data path, there will be a sense amplifier like amplifier 10. This current can be reduced by reducing the gain of transistor 22. Reducing the gain of transistor 22 will also require a commensurate gain reduction for transistor 23 in order to have proper biasing of current mirror 31. Reducing the gain of transistor 23, however, will have the adverse effect of reducing the differential gain provided by transistors 21, 23, and 15.

In effect, differential portion 11 is comprised of current mirror 31 and differential amplifier 34, and differential portion 12 is comprised of current mirror 33 and a differential amplifier 35 comprised of transistors 26, 28 and 18. When enabled, transistors 15 and 18 act as current sources. Current mirrors 31 and 33 act as loads for differential amplifiers 34 and 35. The slave portions, transistors 20 and 25, provide loads for the output signals, signal VO(+) and VO(−). Although the masters, transistors 22 and 27, of current mirrors 31 and 33 could be reduced in gain while maintaining the same gain for the slaves, transistors 20 and 25, there would be other adverse effects. The ratio of the gains of transistors 22 and 23 and transistors 27 and 28 must be maintained to obtain optimum performance of current mirrors 31 and 33. To maintain optimum performance of differential amplifiers 34 and 35, transistors 21 and 23 and transistors 26 and 28 must be matched in gain.

Figure 2:
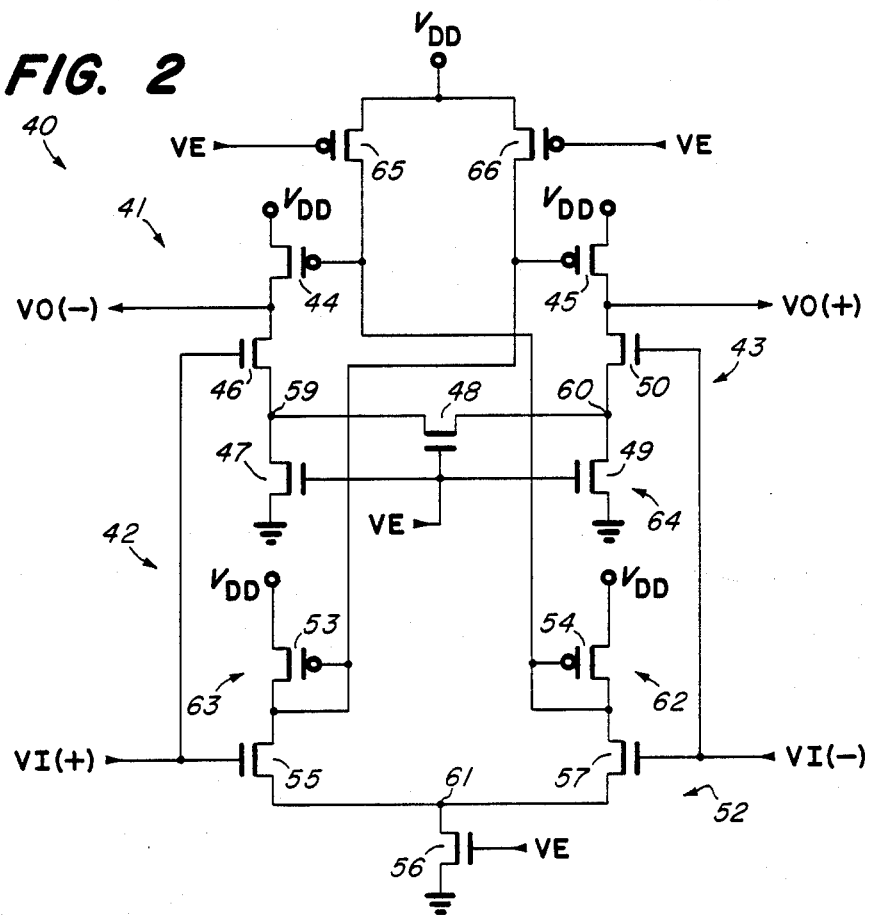
FIG. 2 is a circuit diagram of a sense amplifier according to a preferred embodiment of the invention.

Shown in FIG. 2 is a sense amplifier 40 according to a preferred embodiment of the invention comprised generally of a differential portion 41 and a differential portion 42. Differential portion 41 comprises a differential amplifier 43, a P channel load transistor 44, and a P channel load transistor 45. Differential amplifier 43 comprises N channel transistors 46, 47, 48, 49, and 50. Differential portion 42 comprises a differential amplifier 52, a P channel load transistor 53, and a P channel load transistor 54. Differential amplifier 52 comprises N channel transistors 55, 56 and 57.

Transistor 44 has a source connected to VDD, a drain for providing complementary output signal VO(−), and a gate. Transistor 46 has a drain connected to the drain of transistor 44, a gate for receiving the input signal VI(+), and a source connected to a node 59. Transistor 47 has a drain connected to node 59, a gate for receiving enable signal VE, and a source connected to ground. Transistor 48 has a first current electrode connected to node 59, a gate for receiving signal VE, and a second current electrode connected to a node 60. Transistor 49 has a drain connected to node 60, a gate for receiving signal VE, and a source connected to ground. Transistor 50 has a source connected to node 60, a gate for receiving complementary input signal VI(−), and a drain for providing true output signal VO(+). Transistor 45 has a drain connected to the drain of transistor 50, a source connected to VDD, and a gate. Transistor 53 has a source connected to VDD, a gate and a drain connected to the gate of transistor 45. Transistor 55 has a drain connected to the gate and drain of transistor 53, a gate for receiving signal VI(+), and a source connected to a node 61. Transistor 56 has a drain connected to node 61, a gate for receiving signal VE, and a source connected to ground. When enabled by signal VE, transistor 56 acts as a current source for differential amplifier 52. Transistor 57 has a source connected to node 61, a gate for receiving signal VI(−), and a drain. Transistor 54 has a gate and drain connected to the drain of transistor 57, and a source connected to VDD.

Transistors 44 and 54 comprise a current mirror 62, and transistors 45 and 53 comprise a current mirror 63. Transistor 44 is a slave and transistor 54 is a master of current mirror 62. Transistor 45 is a slave and transistor 53 is a master of current mirror 63. The slaves, transistors 44 and 45, of current mirrors 62 and 63 are the loads for differential amplifier 43. The masters, transistors 53 and 54, are the loads for differential amplifier 52. During sensing by sense amplifier 40, signal VE is a logic high so that transistors 47–49 and 56 are conducting. Transistor 48 acts as an equalizing transistor to keep nodes 59 and 60 at the same voltage. Transistors 47 and 49 act as current sources for differential amplifier 43. For sensing purposes, transistors 47–49 could be replaced by a single transistor, such as transistor 56, with nodes 59 and 60 connected together. Such transistor would have its drain connected to nodes 59 and 60, its source connected to ground, and its gate for receiving signal VE. Transistors 47–49 are used as part of a novel tri-state technique having merit independent of that of the novel arrangement of differential amplifiers and current mirrors of sense amplifier 40.

For sensing in the case in which signal VI(+) is reduced in voltage, transistors 46 and 55 become less conductive in response to signal VI(+). With transistor 55 becoming less conductive, less current flows through transistor 53 and more current flows through transistor 54 via transistor 57. With the master, transistor 53, of current mirror 63 having reduced current, the slave, transistor 45, also has reduced current. Conversely, with the master, transistor 54, of current mirror 62 having increased current, the slave, transistor 44, has increased current carrying capability. Because transistor 46 has reduced conductivity and transistor 44 has increased conductivity, output signal VO(−) will rise in voltage. Transistor 50 will actually become more conductive even if input signal VI(−) does not rise in voltage because there will be reduced current flowing into equalized nodes 59 and 60 causing the voltage at equalized nodes 59 and 60 to be reduced. With transistor 50 having increased conductivity and transistor 45 having reduced conductivity, output signal VO(+) will drop in voltage. Thus, a drop in voltage by input signal VI(+) causes output signal VO(−) to rise and output signal VO(+) to drop, which is the desired result. If input signal VI(+) drops sufficiently low to cause transistors 46 and 55 to become non-conducting, no current will flow through transistor 63 and there will be no current contribution to equalized nodes 59 and 60 from transistor 44. With the master, transistor 53, of current mirror 63 being non-conducting, the slave, transistor 45, is also non-conducting. With transistors 46 and 45 being non-conducting, the only current flowing into equalized nodes 59 and 60 will come externally from amplifier 40 via transistor 50. Consequently, signal VO(+) can actually reach ground potential. Likewise, signal VO(−) can actually reach the potential at VDD.

There is one current path within amplifier 40. Transistors 54, 57 and 56 are all conducting. This current path is analogous to the current path through transistors 22, 23 and 15 of prior art FIG. 1 when input signal VI(+) is a logic low. The difference being that current can be reduced by reducing the gain of the master, transistor 54, without causing a gain mismatch in a differential amplifier. The load transistors have a gain selected to meet drive requirements of the amplifier. Consequently, the gain of transistors 44 and 45 is selected based upon the load driving requirments for output signals VO(−) and VO(+). Transistor 54 can have a gain substantially reduced from that required for transistor 44 because transistor 57 can have a commensurate reduction in gain but still have the same gain as transistor 55. This is because transistor 53 has the same reduction in gain in relation to transistor 45 that transistor 54 has in relation to transistor 44. Consequently, transistor 55 is reduced in gain so that transistors 55 and 57 have the same gain, which is the desired result. Gain is typically altered by altering channel width. Consequently, reducing the gain of transistors 53, 54, 55 and 57 results in reducing the size of these transistors. This is particularly significant for use in a memory because a sense amplifier is used for every group of columns on a data path. Sense amplifier 40 thus saves space and power.

Amplifier 40 thus has two pairs of common source transistors, each pair of which has matched gain. Transistor pair 55, 57 and transistor pair 46, 50 each are thus optimized. Transistor load pair 53, 54 also is matched as is transistor load pair 44 and 45. The output of transistor pair, 55, 57 controls the conductivity of load transistors 44, 45. Instead of the output of differential amplifier 52 being simply cascaded with another amplifier, the output of differential amplifier 52 is used to vary the load, transistors 44 and 45, of an amplifier, differential amplifier 43, which is connected in parallel. Consequently, the gain of differential amplifier 52 is used to an advantage without causing an additional propagation delay which is true of cascaded amplifiers.

Transistors 47-49 form a tri-state configuration 64 which is used to replace a resistive component in a differential amplifier to enable the differential amplifier to obtain a tri-state condition. When signal VE is a logic high, transistors 47 and 49 act as resistive elements for differential amplifier 43, and transistor 48 equalizes nodes 59 and 60. Transistors 47 and 49 are each chosen to be half of the gain that is required for desired operation of differential amplifier 43. Consequently, transistors 47 and 49 conducting together supply the desired gain. Transistor 48 ensures that nodes 59 and 60 are maintained at the same voltage which is required for proper operation of differential amplifier 43.

When high impedance outputs are desired, signal VE switches to a logic low causing transistors 47-49 to become non-conducting. The sources of transistors 46 and 50 are then isolated from ground and each other. Consequently, there is no path to ground or to transistor 50 through transistor 46. Likewise, there is no path to ground or to transistor 46 through transistor 50. Sense amplifier 40 further comprises P channel transistors 65 and 66 for turning off load transistors 44, 45, 53 and 54. Transistor 65 has a source connected to VDD, a gate for receiving signal VE, and a drain connected to the gate of transistor 44. Transistor 66 has a source connected to VDD, a gate for receiving signal VE, and a drain connected to the gate of transistor 45. In the high impedance condition with signal VE at a logic low, transistors 65 and 66 couple the potential at VDD to the gates of transistors 44 and 45, respectively, causing transistors 44 and 45 to be non-conducting. A high impedance is thus provided at the connection of the drains of transistors 44 and 46 and at the connection of the drains of transistors 45 and 50. The high impedance state is commonly referred to as tri-state, there being three conditions; logic high, logic low and high impedance. Consequently, sense amplifier 40 is a tri-state sense amplifier in which signals VO(+) and VO(−) provided by sense amplifier 40 can represent a logic high, a logic low, or a high impedance condition. If the sources of transistors 46 and 50 were connected together as in a conventional differential amplifier, signals VO(−) and VO(+) would not be isolated from each other. When sense amplifier 40 is to be in a high impedance condition, signals from other sources on lines that signals VO(+) and VO(−) are coupled to, may be present. It is undesirable that such signals be coupled to each other via transistors 46 and 50 which would occur because transistors 46 and 50 will be conducting with 3 volts on their gates. Transistor 48 effectively couples nodes 59 and 60 for a sensing operation and effectively separates them for high impedance operation. Additionally, the tri-state technique does not interfere with the output drive of sense amplifier 40. Although transistor 48 must be relatively large in relation to the other N channel transistors of amplifier 40, it operates in its highest gain region because nodes 59 and 60 will be relatively low in voltage, typically one volt or lower. If a transistor is interposed between the drain connections of transistors 44 and 46 and transistors 45 and 50, the transistor would be more effective in coupling one logic state than the other. If both P and N channel devices are used, some additional resistance is still present, the devices must still be quite large for sufficient gain, and the part count is proliferated. The present technique also requires four extra transistors but only one is large and there is not nearly as much extra series impedance. In fact, for the logic high outputs, there is no extra series impedance. The extra impedance introduced by transistor 48 to ground via nodes 59 and 60 is relatively low.

Sense amplifier 40 thus has improved tri-state operation, reduced current consumption, and a reduced area requirement. For amplifier 40, all of the gate lengths are 1.3 microns. Transistors 44, 45 and 48 each have a channel width of 100 microns. Transistors 53 and 54 each have a channel width of 40 microns. Transistors 46 and 50 each have a channel width of 30 microns. Transistors 47 and 49 each have a channel width of 22 microns. Transistors 55 and 57 each have a channel width of 10 microns. Transistor 56 has a channel width of 45 microns.

Figure 3:
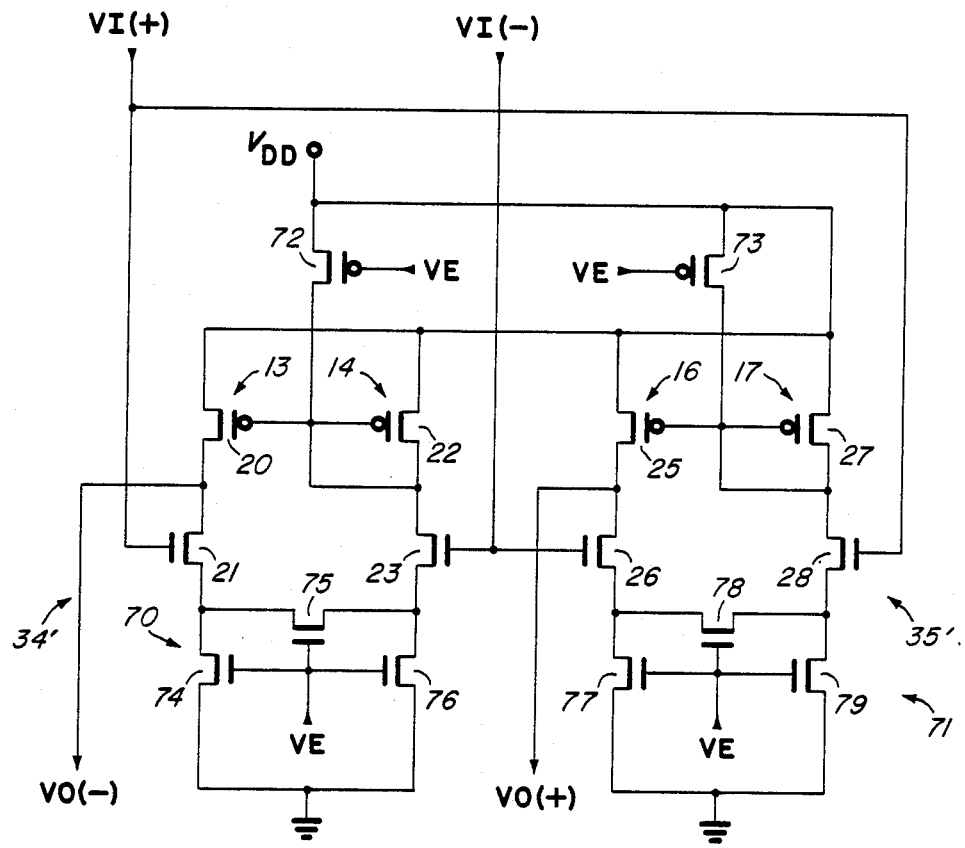
FIG. 3 is a circuit diagram of a sense amplifier which combines an inventive feature of the sense amplifier of FIG. 2 with the prior art sense amplifier of FIG. 1.

Shown in FIG. 3 is a sense amplifier 10' which is sense amplifier 10 modified to use the tri-state configuration shown in FIG. 2. Transistors 15 and 18 have been replaced with tri-state configurations 70 and 71, respectively. Additionally, P channel transistors 72 and 73 have been added. Tri-state configuration 70 comprises N channel transistors 74, 75 and 76. Tri-state configuration 71 comprises N channel transistors 77, 78 and 79. Transistor 72 has a source connected to VDD, a gate for receiving signal VE, and a drain connected to the gate of transistor 20. Transistor 73 has a source connected to VDD, a gate for receiving signal VE, and a drain connected to the gate of transistor 16. Transistor 74 has a drain connected to the source of transistor 21, a gate for receiving signal VE, and a source connected to ground. Transistor 75 has a first current electrode connected to the source of transistor 23, a control electrode for receiving signal VE, and a second current electrode connected to the source of transistor 21. Transistor 76 has a drain connected to the source of transistor 23, a gate for receiving signal VE, and a source connected to ground. Transistor 77 has a drain connected to the source of transistor 26, a gate for receiving signal VE, and a source connected to ground. Transistor 78 has a first current electrode connected to the source of transistor 26, a control electrode for receiving signal VE, and a second current electrode connected to the source of transistor 28. Transistor 79 has a drain connected to the source of transistor 28, a gate for receiving signal VE, and a source connected to ground.

For a sensing operation, signal VE is a logic high so that transistors 74-79 are all conducting. Transistors 74, 76, 77 and 79 act as resistive elements while transistors 75 and 78 ensure that the sources of transistors 21 and 23 are at the same potential, and the sources of transistors 26 and 28 are at the same potential. Transistors 72 and 73 are turned off so they do not affect the operation of amplifier 10'. When signal VE is a logic low, transistors 72 and 73 are turned on, causing transistors 20 and 25 to turn off. Transistors 74-79 are turned off by signal VE switching to a logic low. With transistors 74 and 75 not conducting, the source of transistor 21 is a high impedance node making the drain of transistor 21 a high impedance node even with transistor 21 turned on. Transistor 76 being turned off blocks a current path from transistors 72 and 23. Likewise, transistors 77-79 being non-conducting causes the drain of transistor 26 to be a high impedance node and blocks a current path from transistors 73 and 28.

Consequently, the tri-state technique used for amplifier 40 of FIG. 2 is applicable to other amplifiers. The tri-state technique is implemented more efficiently in sense amplifier 40 because only one tri-state configuration is required whereas amplifier 10' requires two tri-state configurations.

Figure 4:
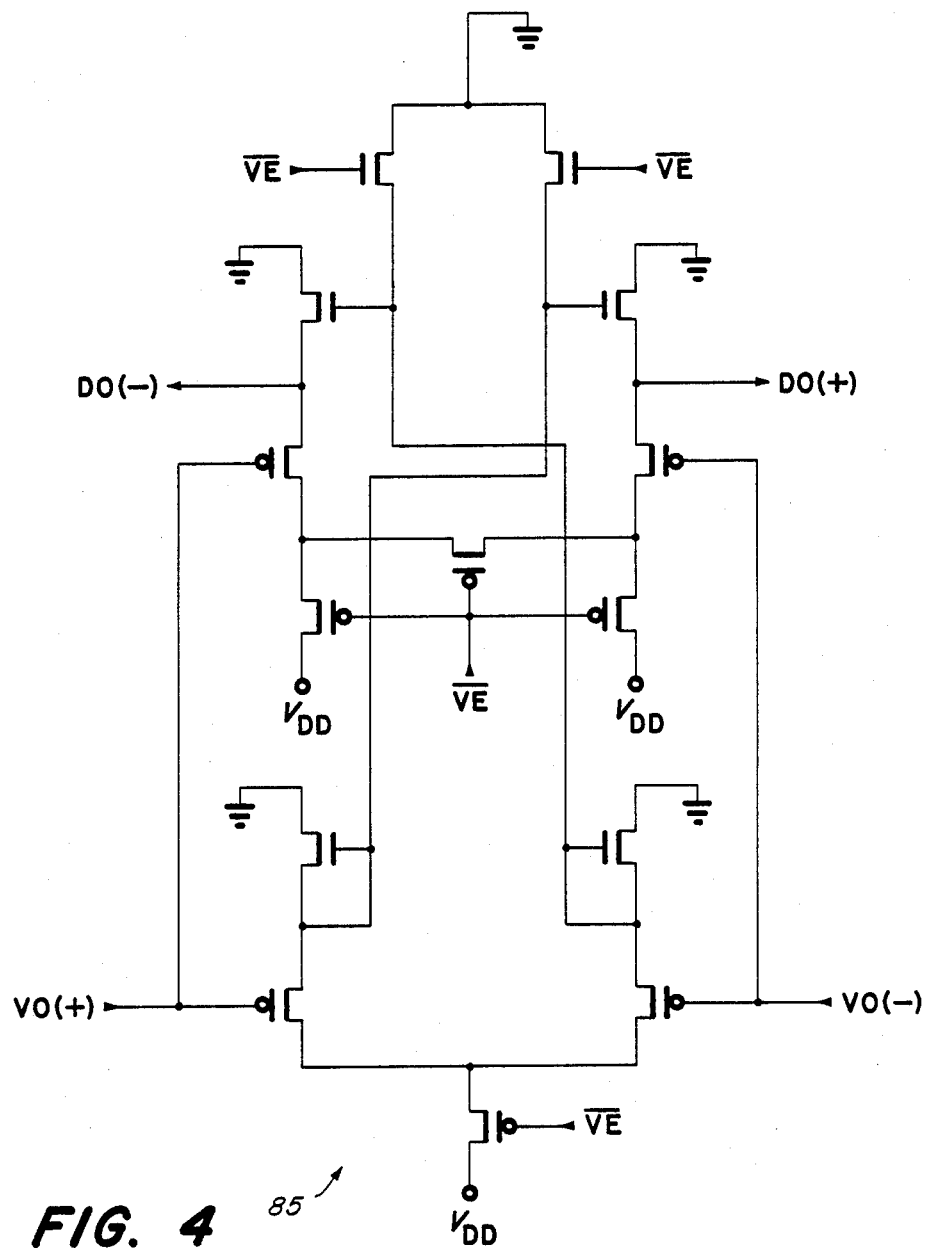
FIG. 4 is a circuit diagram of amplifier complementary to the sense amplifier of FIG. 2.

Shown in FIG. 4 is an amplifier 85 for receiving the output signals VO(+) and VO(−) of amplifier 40 of FIG. 2 and providing data output signals DO(+) and DO(−) in response thereto. Amplifier 85 is the same as amplifier 40 except that it is complementary which means that the N channel transistors of amplifier 40 become P channel transistors in amplifier 85, the P channel transistors in amplifier 40 become N channel transistors in amplifier 85, the power supply polarities are reversed, and the enable signal VE is complemented. Consequently, N channel differential amplifiers 52 and 43 become P channel differential amplifiers, and P channel load pairs 44, 45 and 53, 54 become two N channel load pairs. This scheme matches the common-mode biasing level of the output of one amplifier section, amplifier 40, to the optimum level for the input of the subsequent amplifier section, amplifier 85. This results in a large improvement in gain and power characteristics.

I claim:

1. A differential amplifier having an amplify mode and a tri-state mode, comprising:
    a first transistor having a control electrode for receiving a first input signal, a first current electrode coupled to a load node, and a second current electrode;
    a second transistor having a control electrode for receiving a second input signal, a first current electrode coupled to a second load node, and a second current electrode;
    a third transistor having a control electrode for receiving an enable signal, a first current electrode coupled to the second current electrode of the first transistor, and a second current electrode coupled to the second current electrode of the second transistor;
    a fourth transistor having a control electrode for receiving the enable signal, a first current electrode coupled to the second current electrode of the first transistor, and a second current electrode coupled to the first power supply terminal;
    a fifth transistor having a control electrode for receiving the enable signal, a first current electrode coupled to the second current electrode of the second transistor, and a second current electrode coupled to the first power supply terminal;
    a first switchable load coupled between a second power supply terminal and the first load node;
    a second switchable load coupled between the second power supply terminal and the second load node; and
    load control means for switching off the first and second switchable loads in the tri-state mode.

2. The amplifier of claim 1 wherein the load control means comprises:
    a sixth transistor having a control electrode coupled to the enable signal, a first current electrode coupled to the second power supply terminal, and a second current electrode coupled to the first switchable load means; and
    a seventh transistor having a control electrode for receiving the enable signal, a first current electrode coupled to the second power supply terminal, and a second current electrode coupled to the second switchable load means.

3. The amplifier of claim 2 wherein the first switchable load comprises:
    an eighth transistor having a control electrode coupled to the second current electrode of the sixth transistor, a first current electrode coupled to the second power supply terminal, and a second current electrode coupled to the first load node.

4. The amplifier of claim 3 wherein the second switchable load comprises:
a ninth transistor having a control electrode coupled to the second current electrode of the seventh transistor, a first current electrode coupled to the second power supply terminal, and a second current electrode coupled to the second load node.

5. The amplifier of claim 4 further comprising:
a tenth transistor having a control electrode for receiving the first input signal, a first current electrode coupled to the control electrode of the ninth transistor, and a second current electrode;
an eleventh transistor having a control electrode for receiving the second input signal, a first current electrode coupled to control electrode of the eighth transistor, and a second current electrode; and
a current source means, coupled between the first power supply terminal and the second current electrodes of the tenth and eleventh transistors, for providing current therebetween during the first mode and preventing current therebetween during the second mode.

6. The amplifier of claim 5 further comprising:
a twelfth transistor having a first current electrode coupled to the second power supply terminal, and a control electrode and a second current electrode coupled to the first current electrode of the tenth transistor, and
a thirteenth transistor having a first current electrode coupled to the second power supply terminal, and a control electrode and a second current electrode coupled to the first current electrode of the eleventh transistor.

7. The amplifier of claim 6 wherein the second current source comprises:
a fourteenth transistor having a control electrode coupled to the enable signal, a first current electrode coupled to the second current electrodes of the tenth and eleventh transistors, and a second current electrode coupled to the first power supply terminal.

8. The amplifier of claim 7 wherein the first, second, third, fourth, fifth, tenth, eleventh, and fourteenth transistors are of a first conductivity type; and the sixth, seventh, eighth, ninth, twelfth, and thirteenth transistors are of a second conductivity type.

* * * * *